(12) United States Patent
Procopio et al.

(10) Patent No.: US 10,458,361 B2
(45) Date of Patent: Oct. 29, 2019

(54) COATING FOR METAL COMPONENTS, METHOD FOR COATING A METAL COMPONENT, PISTON FOR INTERNAL COMBUSTION ENGINES AND MOTOR VEHICLE

(71) Applicant: Bayerische Motoren Werke Aktiengesellschaft, Munich (DE)

(72) Inventors: Andrea Procopio, Freising (DE); Nigel Stothard, Munich (DE); Stefan Ungar, Landshut (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 150 days.

(21) Appl. No.: 15/403,556

(22) Filed: Jan. 11, 2017

(65) Prior Publication Data

US 2017/0122249 A1  May 4, 2017

Related U.S. Application Data

(63) Continuation of application No. PCT/EP2015/068128, filed on Aug. 6, 2015.

(30) Foreign Application Priority Data

Aug. 27, 2014 (DE) .......................... 10 2014 217 040

(51) Int. Cl.
  *C23C 14/06* (2006.01)
  *F02F 3/10* (2006.01)
  (Continued)

(52) U.S. Cl.
  CPC .............. *F02F 3/10* (2013.01); *C23C 14/024* (2013.01); *C23C 14/0605* (2013.01);
  (Continued)

(58) Field of Classification Search
  USPC ...................................................... 123/193.6
  See application file for complete search history.

(56) References Cited

U.S. PATENT DOCUMENTS 4,525,417 A  6/1985 Dimigen et al.
6,142,481 A * 11/2000 Iwashita ................. C23C 16/26
                                                     277/442
(Continued)

FOREIGN PATENT DOCUMENTS

CN  102597191 A  7/2012
CN  103261476 A  8/2013
(Continued)

OTHER PUBLICATIONS

International Search Report (PCT/ISA/210) issued in PCT Application No. PCT/EP2015/068128 dated Nov. 16, 2015 with English-language translation (six (6) pages).
(Continued)

*Primary Examiner* — Archene A Turner
(74) *Attorney, Agent, or Firm* — Crowell & Moring LLP

(57) ABSTRACT

An abrasion-resistant and friction-reduced coating for metal components is provided. The coating includes an inner layer, an intermediate layer and an outer layer. The inner layer is intended to be applied to the metal component and has at least one layer selected from: a metal layer, a metal-carbide layer, a metal-nitride layer, a metalcarbide- nitride layer and a metal-containing hydrocarbon layer. The intermediate layer includes at least one layer of amorphous carbon and the outer layer includes a W—C:H layer or a a-C:H* layer. A maximum layer thickness of the coating is at most 5 μm. The coating is suitable in particular as a piston coating for use in internal combustion engines.

6 Claims, 3 Drawing Sheets

(51) Int. Cl.
*C23C 28/04* (2006.01)
*C23C 28/00* (2006.01)
*F16J 9/26* (2006.01)
*C23C 14/14* (2006.01)
*C23C 14/24* (2006.01)
*C23C 16/32* (2006.01)
*C23C 16/34* (2006.01)
*C23C 16/36* (2006.01)
*C23C 16/50* (2006.01)
*C23C 14/02* (2006.01)
*C23C 16/02* (2006.01)
*C23C 16/26* (2006.01)

(52) U.S. Cl.
CPC ...... *C23C 14/0635* (2013.01); *C23C 14/0641* (2013.01); *C23C 14/0664* (2013.01); *C23C 14/14* (2013.01); *C23C 14/24* (2013.01); *C23C 16/0272* (2013.01); *C23C 16/26* (2013.01); *C23C 16/32* (2013.01); *C23C 16/34* (2013.01); *C23C 16/36* (2013.01); *C23C 16/50* (2013.01); *C23C 28/042* (2013.01); *C23C 28/044* (2013.01); *C23C 28/046* (2013.01); *C23C 28/048* (2013.01); *C23C 28/322* (2013.01); *C23C 28/324* (2013.01); *C23C 28/34* (2013.01); *C23C 28/343* (2013.01); *C23C 28/347* (2013.01); *C23C 28/36* (2013.01); *F16J 9/26* (2013.01)

(56) References Cited

U.S. PATENT DOCUMENTS

| | | | | |
|---|---|---|---|---|
| 6,599,400 B2 * | 7/2003 | Strondl | ............... | C23C 14/025 134/1.1 |
| 2006/0225682 A1 | 10/2006 | Evans et al. | | |
| 2007/0054125 A1 * | 3/2007 | Akari | ............... | C23C 14/024 428/408 |
| 2009/0001669 A1 | 1/2009 | Hoppe et al. | | |
| 2009/0202790 A1 * | 8/2009 | Eerden | ............... | C23C 28/00 428/195.1 |
| 2011/0101620 A1 | 5/2011 | Hoppe et al. | | |
| 2012/0177915 A1 | 7/2012 | Kasai et al. | | |
| 2012/0205875 A1 | 8/2012 | Kennedy et al. | | |
| 2013/0168906 A1 | 7/2013 | Kennedy et al. | | |
| 2013/0269648 A1 | 10/2013 | Rehl et al. | | |
| 2013/0316156 A1 | 11/2013 | Kennedy et al. | | |
| 2014/0323368 A1 * | 10/2014 | Avelar Araujo | ...... | C23C 14/024 508/105 |
| 2015/0018254 A1 * | 1/2015 | Araujo | ............... | F16J 9/26 508/105 |
| 2015/0240944 A1 | 8/2015 | Ivanov et al. | | |
| 2015/0300493 A1 | 10/2015 | Kunimoto et al. | | |

FOREIGN PATENT DOCUMENTS

| | | |
|---|---|---|
| DE | 195 13 614 C1 | 10/1996 |
| DE | 10 2006 004 750 A1 | 10/2006 |
| DE | 10 2005 063 123 B3 | 5/2007 |
| DE | 10 2008 016 864 B3 | 10/2009 |
| DE | 10 2009 028 504 B3 | 1/2011 |
| DE | 10 2010 002 688 A1 | 9/2011 |
| DE | 10 2010 047 279 A1 | 5/2012 |
| DE | 10 2010 062 114 A1 | 5/2012 |
| EP | 0 087 836 A1 | 9/1983 |
| EP | 0 905 420 B1 | 5/2003 |
| EP | 0 905 419 B1 | 11/2003 |
| EP | 2 674 514 A1 | 12/2013 |
| EP | 1 760 172 B1 | 1/2015 |
| JP | 2003-42294 A | 2/2003 |
| JP | 2004-010923 * | 1/2004 |
| JP | 2004-169137 * | 6/2004 |
| JP | 2009-174009 * | 8/2009 |
| JP | 2014-129826 A | 7/2014 |
| WO | WO 2013/120157 A1 | 8/2013 |
| WO | WO 2014/023615 A1 | 2/2014 |

OTHER PUBLICATIONS

German-language Written Opinion (PCT/ISA/237) issued in PCT Application No. PCT/EP2015/068128 dated Nov. 16, 2015 (five (5) pages).

German Search Report issued in counterpart German Application No. 10 2014 217 040.0 dated May 21, 2015 with partial English-language translation (eleven (11) pages).

Chinese-language Office Action issued in counterpart Chinese Application No. 201580022519.2 dated Apr. 19, 2018 with English translation (17 pages).

* cited by examiner

COATING FOR METAL COMPONENTS, METHOD FOR COATING A METAL COMPONENT, PISTON FOR INTERNAL COMBUSTION ENGINES AND MOTOR VEHICLE

CROSS REFERENCE TO RELATED APPLICATIONS

This application is a continuation of PCT International Application No. PCT/EP2015/068128, filed Aug. 6, 2015, which claims priority under 35 U.S.C. § 119 from German Patent Application No. 10 2014 217 040.0, filed Aug. 27, 2014, the entire disclosures of which are herein expressly incorporated by reference.

BACKGROUND AND SUMMARY OF THE INVENTION

The present invention relates to a coating for metal components which is employed, in particular, as a piston coating for pistons in internal combustion engines, as well as to a process for coating a metal component. In addition, the invention relates to a piston for internal combustion engines and a motor vehicle having the piston according to the invention.

To increase the resistance and, in particular, for use in tribologically highly stressed applications, steel components are coated with an abrasion-resistant and friction-reducing layer to reduce wear and friction. DE 10 2010 047279 A1 discloses a coating for pistons for internal combustion engines, which consists of a wear-resistant inner layer composed of a polymer matrix with ceramic particles, aramid fibers and/or carbon fibers dispersed therein and an outer layer composed of a polymer matrix with solid lubricants dispersed therein. Disadvantages of this piston coating are the reduced adhesion to the piston surface and an insufficiently low coefficient of friction, in particular during the running-in time of the piston.

Proceeding from this prior art, it is therefore an object of the present invention to provide a coating for metal components and also a piston for internal combustion engines, which display a high abrasion resistance combined with a durably low coefficient of friction. In addition, it is an object of the invention to provide a motor vehicle which has a low fuel consumption and reduced $CO_2$ emission and hydrocarbon emission. It is likewise an object of the invention to provide a coating process for metal components having high stability and good tribological properties, which process is easy to implement.

In the case of a coating for metal components, these and other objects are achieved according to the invention by a multilayer structure. The multilayer structure comprises an inner layer which acts as bonding layer and bonds directly to the metal component and can provide a good bond between the coating and the metal material. For this purpose, the inner layer comprises at least one layer which is selected from among a metal layer, a metal carbide layer, a metal nitride layer, a metal carbonitride layer and a metal-containing hydrocarbon layer, and can also comprise combinations of individual layers of these types. The metals in the respective individual layers of the inner layer can comprise one metal or be used in doped form. Particularly suitable doping elements are selected from the group consisting of boron (B), nitrogen (N), silicon (Si), oxygen (O), fluorine (F), phosphorus (P), tantalum (Ta), molybdenum (Mo), nickel (Ni), chromium (Cr), gold (Au), niobium (Nb), tungsten (W), copper (Cu) and titanium (Ti), and can be selected according to the desired property to be achieved. It is also possible to employ combinations of a plurality of doping elements. Typical contents of the doping elements are in the range from 5 to 50 at %, preferably from 20 to 50 at %, in each case based on the total content of the respective metal in the individual layer. The proportion of dopant in the inner layer is preferably gradated and decreases in the direction of the metal component to be coated. All individual layers of the inner layer have a metal content which can form a good bond with the metal surface and thus achieve good adhesion of the coating.

An intermediate layer which comprises at least one layer of amorphous carbon and thereby introduces friction-reducing properties into the coating is applied on top of the inner layer. The layer of amorphous carbon is not subject to any detailed restrictions and can be selected according to the desired physical, mechanical and chemical resistance. Suitable amorphous carbon layers are known, for example, from the VDI Guideline 2840.

A covering layer applied on top of the intermediate layer forms a surface layer which is in contact with the surroundings of the metal component. According to the invention, the covering layer comprises a W—C:H layer or an a-C:H* layer. In other words, a W—C:H layer or an a-C:H* layer thus forms an outermost layer of the coating of the invention, which is in direct contact with the surroundings of a metal component to be coated.

For the purposes of the invention, a W—C:H layer is a hydrocarbon-containing tungsten layer. An a-C:H* layer is a gradated layer of amorphous carbon which is composed of diamond-like parts ($sp^3$ hybridization) and graphite-like parts ($sp^2$ hybridization), where the proportion of graphite-like parts is greater than in an a-C:H layer (DCL—diamond-like carbon) and is, in particular, from 20 to 50 at % and a proportion of diamond-like parts is from 10 to 30 at %. The hardness increases in the direction of the metal component, i.e. in the direction of the inner layer, so that the $sp^2$ proportion decreases in the direction of the inner layer and the $sp^3$ proportion increases. The a-C:H* layer can be doped with nitrogen or hydrogen or another doping element in order to decrease the hardness. Typical contents of the doping elements are in the range from 5 to 50 at %, preferably from 20 to 50 at %. The proportion of dopant in the covering layer is preferably gradated and decreases in the direction of the metal component to be coated. A particularly advantageous effect can be achieved thereby: when the covering layer is subjected to friction, solid lubricant particles are formed and bring about an additional reduction in the coefficient of friction of the coating of the invention. Thus, for example, when the coating is correctly used, tungsten sulfide is formed from sulfur from a lubricating oil and the W—C:H covering layer and graphite is generated from the a-C:H* layer. A high $sp^2$ hybridization content, i.e. an at least higher proportion of $sp^2$ parts, as is present in a conventional a-C:H layer, is therefore advantageous for the formation of graphite. The formation of the solid lubricant directly from the covering layer has the advantage over particulate, solid lubricants, for example those present in a polymer composite, that they are formed selectively where abrasion of the covering layer has occurred, so that the sliding properties of the coating remain equally good over a long time and the stability of the remaining layer composite is not impaired.

However, the effects according to the invention can be achieved only when the layer composite is intrinsically stable, abrasion-resistant and friction-reducing. This is achieved by a maximum layer thickness of the coating being not more than 5 µm. Owing to the high abrasion resistance and very good tribological properties of the coating according to the invention, the coating is particularly suitable as coating for pistons for use in internal combustion engines. Even under the very high frictional stresses and high temperatures occurring there, the coating is stable and displays durable low coefficients of friction. Even when the coating has been partly abraded away, the friction of the piston in a slideway surrounding it (cylinder interior) is reduced sufficiently since further solid lubricant is formed from the covering layer at any time by operation of the piston. Thus, the piston/slideway system can run in more quickly, which is particularly advantageous with a view to engine start-stop automation, which goes through a critical rotational speed during starting.

An advantageous layer structure of the inner layer provides a Cr layer (chromium layer), a Cr/WC layer (chromium/tungsten carbide layer) and a W—C:H layer or a CrN layer (chromium nitride layer), a Cr/WC layer and a W—C:H layer or a Cr layer, a CrN layer and a Cr/WC layer, each of which are arranged or applied on top of one another in this order. The Cr layer or the CrN layer thus forms the lowermost layer of the inner layer. Instead of the W—C:H layer, it is also possible to use a WC/W—C:H layer. The Cr layer or the CrN layer is intended to be applied to the metal component. Owing to their metallic character, these layers are particularly well suited for forming a stable, abrasion-resistant bond to metal materials and in particular to steels or aluminum alloys and can be produced at acceptable prices. The Cr/WC layer serves as support layer and ensures good stability within the layer composite in the inner layer. Due to its proportion of Cr, it can form a mechanically particularly stable and abrasion-resistant bond to the Cr layer or CrN layer joined to it. On the other hand, the tungsten content ensures good bonding to the W—C:H layer, which additionally makes a contribution to minimizing friction of the coating of the invention.

With a view to reducing the coefficient of friction of the coating for metal components, the intermediate layer also advantageously comprises an a-C:H layer. An a-C:H layer is an amorphous carbon layer (also known as DLC (diamond-like carbon)), which has an $sp^3$ proportion of at least 20 at %. The a-C:H layer can be doped, for example with hydrogen (H), Si, N, P or oxygen. Typical contents of the doping elements are in the range from 5 to 50 at %, preferably from 20 to 50 at %. The proportion of dopant in the intermediate layer is preferably gradated and decreases in the direction of the metal component to be coated.

A further advantageous embodiment provides for the intermediate layer to comprise an a-C:H layer and an a-C:H* layer, where the a-C:H layer is arranged facing the inner layer and the a-C:H* layer is arranged facing the covering layer. Due to the higher proportion of $sp^2$ parts in the a-C:H* layer compared to the a-C:H layer, the hardness of the intermediate layer decreases in the direction of the covering layer. This leads, in combination with the covering layer, to a soft top layer which has good running-in properties and displays very good coefficients of friction. In the direction of the inner layer, the a-C:H layer ensures, due to its higher hardness, good stability of the layer structure and very good adhesion in the layer composite.

In a particularly advantageous embodiment, the coating for metal components is characterized in that the inner layer is formed by a Cr layer, a Cr/WC layer and a W—C:H layer, and the layers are applied in this order or layer sequence to a metal component. The Cr layer is bound directly to the metal component, i.e. applied to the metal component. According to this embodiment, the intermediate layer is an a-C:H layer and the covering layer is a W—C:H layer or an a-C:H* layer. As an alternative, the coating of the invention for metal components is characterized in that the inner layer is formed by a Cr layer, a Cr/WC layer and a WC/W—C:H layer in this order, where the Cr layer is intended to be applied to the metal component. The intermediate layer additionally comprises an a-C:H layer facing the inner layer and an a-C:H* layer facing the covering layer. A W—C:H layer is provided as covering layer. These coatings have a very balanced property spectrum in respect of mechanical stability, abrasion resistance and very good tribological properties and are particularly well suited as coating for pistons for internal combustion engines.

The invention likewise describes a piston for internal combustion engines which displays a high abrasion resistance and very good sliding properties combined with very good frictional and wear behavior. The piston is a metal component pursuant to the invention, for example made of aluminum, and has a coating as described above. The coating can be applied to part of the piston surface or else completely surround the piston sliding surface, known as the piston skirt. Compared to a merely partial coating, this has the advantage that the piston is coated around the entire circumference of its surfaces which are in contact with a piston slideway and is thus protected against frictional wear. The piston of the invention displays quiet running behavior, a low wear rate and high abrasion resistance combined with a high operational range, by way of which fuel consumption can be reduced and $CO_2$ emission and hydrocarbon emission can thus be reduced or minimized.

Furthermore, the invention also describes a motor vehicle which has at least one piston as described above. The motor vehicle is characterized by high ride comfort, low fuel consumption and low $CO_2$ emission.

The invention additionally provides a process for coating metal components. The coating is configured as multilayer structure. The process comprises the action steps of:
  applying an inner layer comprising at least one layer selected from among: a metal layer, a metal carbide layer, a metal nitride layer, a metal carbonitride layer, a metal-containing hydrocarbon layer and combinations thereof; to a metal component,
  applying an intermediate layer on top of the inner layer, where the intermediate layer comprises at least one layer of amorphous carbon, and
  applying a covering layer which comprises a W—C:H layer or an a-C:H* layer.

The multilayer structure is configured so that a maximum layer thickness of the coating is not more than 5 µm. As regards the definitions of the individual layers, reference is made to what has been said in respect of the coating according to the invention for metal components. The process is easy to implement inexpensively by application of the respective individual layers on top of one another using standard processes without a great engineering outlay and makes it possible to produce an abrasion-resistant and mechanically stable coating having very good sliding properties and thus a low coefficient of friction. The process is particularly suitable for the production of coatings for pistons which are employed in internal combustion engines.

The advantages, advantageous effects and embodiments described for the coating of the invention also apply to the piston of the invention, the motor vehicle of the invention and the coating process of the invention for metal components.

One advantageous embodiment of the process of the invention provides for the application of the layers to be carried out by use of physical or chemical vapor deposition, in particular by PVD or PECVD. The processes described here are easy to implement and allow the formation of layers having a precise layer thickness while avoiding defect structures.

To increase the abrasion resistance of the coating on the metal surface, a Cr layer, a Cr/WC layer and a W—C:H layer or a CrN layer, a Cr/WC layer and a W—C:H layer or a Cr layer, a CrN layer and a Cr/WC layer are deposited in succession in order to apply the inner layer to the metal component.

The solutions according to the invention and the further developments thereof provide the following advantages:

The coating is abrasion-resistant, mechanically stable and thus withstands high friction forces.

The coating has very good tribological properties, i.e. very good sliding properties combined with a low coefficient of friction, and is therefore particularly suitable for tribologically highly stressed applications.

The piston has a durably quiet running behavior, good abrasion resistance and low coefficients of friction in the surrounding piston slideway.

The motor vehicle has a long operational range combined with a low fuel consumption, low $CO_2$ emission rates and low hydrocarbon emission rates.

The coating process can be implemented easily and thus inexpensively without a great engineering outlay by combination of standard processes.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
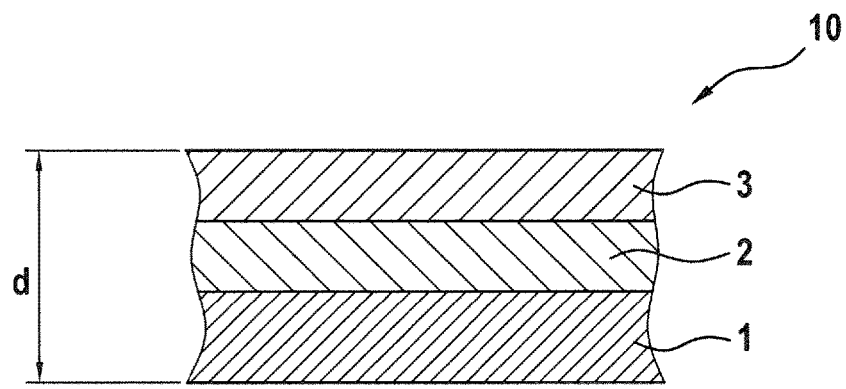
FIG. 1 illustrates a coating for metal components according to a first embodiment.

The present invention will be explained in detail with the aid of working examples. In the figures, only the parts of the coating of the invention or of the piston of the invention which are of interest here are depicted; all other elements have been left out in the interests of clarity. Furthermore, identical reference numerals denote identical elements.

In detail, FIG. 1 shows a layer structure of a coating 10 for metal components according to a first advantageous embodiment of the invention. The coating 10 has three individual layers which are arranged on top of one another so that the superposed layer in each case covers the layer located underneath. The first layer is an inner layer 1. The inner layer 1 is provided for establishing direct contact with a metal component and thus serves to bond the coating 10 to the metal component. The inner layer 1 includes at least one layer which is selected from among a metal layer, a metal carbide layer, a metal nitride layer, a metal carbonitride layer and a metal-containing hydrocarbon layer. Owing to the metal content, the inner layer 10 adheres well to metal surfaces. The coating 10 further includes an intermediate layer 2 which is arranged on top of the inner layer 1. The intermediate layer 2 includes at least one layer of amorphous carbon, preferably of a-C:H or a combination of an a-C:H layer facing the inner layer and a superposed a-C:H* layer. A covering layer 3 is arranged on top of the intermediate layer 2. The covering layer 3 includes or is formed by a W—C:H layer or an a-C:H* layer. The intermediate layer 2 and, in particular, the covering layer 3 are responsible for the very good sliding properties of the coating 10. As a result of friction, the covering layer 3 is capable of forming solid lubricants, namely tungsten sulfide in the case of a covering layer composed of W—C:H and graphite in the case of a covering layer composed of a-C:H*. In the case of an a-C:H* covering layer, the proportion of $sp^2$ parts in the a-C:H* layer is greater than the proportion of $sp^2$ parts in an a-C:H intermediate layer. A maximum layer thickness d of the coating 10 is not more than 5 μm.

Figure 2:
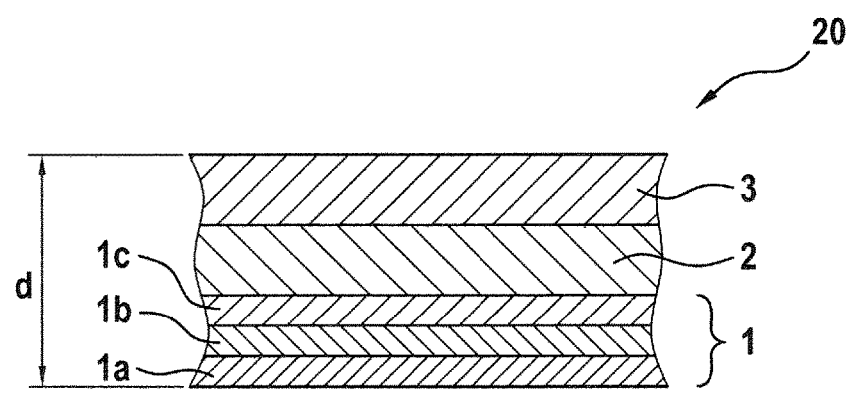
FIG. 2 illustrates a coating for metal components according to a second embodiment.

FIG. 2 likewise shows a layer structure of a coating 20 for metal components. The coating 20 differs from that in FIG. 1 in that the inner layer 1 itself has a multilayer structure. The inner layer 1 is formed by a Cr layer 1a, a Cr/WC layer 1b and a W—C:H layer 1c. The Cr layer 1a is the layer of the inner layer 1 which is intended to be applied to a metal component and bonded to the metal component. The abrasion resistance, mechanical stability and the layer structure stability of the coating 20 can be improved by the multilayer structure of the inner layer 1. A layer thickness d of the coating 20 is likewise not more than 5 μm. As an alternative to the Cr layer 1a, a CrN layer can also be used.

Figure 3:
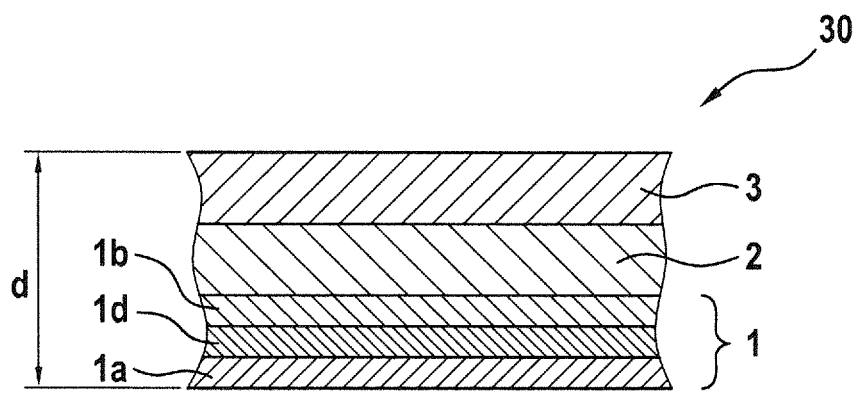
FIG. 3 illustrates a coating for metal components according to a third embodiment.

FIG. 3 shows a further layer structure according to the invention of a coating 30 for metal components. The coating 30 differs from that in FIG. 2 in that the inner layer 1 has a multilayer structure formed by a Cr layer 1a, a CrN layer 1d and a Cr/WC layer 1b. The Cr layer 1a is again the layer of the inner layer 1 which is intended to be applied to a metal component and bonded to the metal component. The abrasion resistance, mechanical stability and the layer structure stability of the coating 30 can also be improved by this multilayer structure of the inner layer 1. A layer thickness d of the coating 30 is likewise not more than 5 μm.

Figure 4:
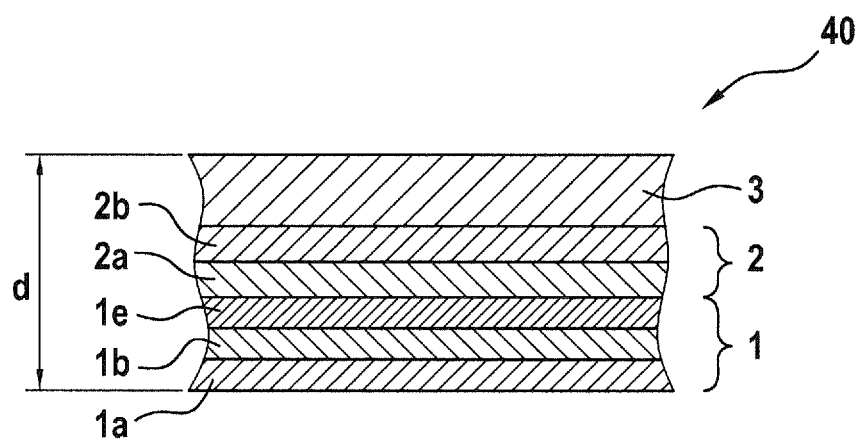
FIG. 4 illustrates a coating for metal components according to a fourth embodiment and FIG. 5 illustrates a sectional view of part of a piston according to an advantageous further development.

FIG. 4 shows a layer structure of a coating 40 for metal components according to a fourth embodiment. The coating 40 again includes a three-layer structure of the inner layer 1, which includes a Cr layer 1a, a Cr/WC layer 1b and a WC/WC:H layer 1e. Unlike the coatings in FIGS. 1 to 3, the intermediate layer 2 is a two-layer structure which includes an a-C:H layer 2a facing the inner layer 1 and an a-C:H* layer 2b facing the W—C:H covering layer 3. A coating 40 having very good tribological properties and good adhesion can also be obtained by use of this layer structure. A layer thickness d of the coating 30 is not more than 5 μm.

Figure 5:
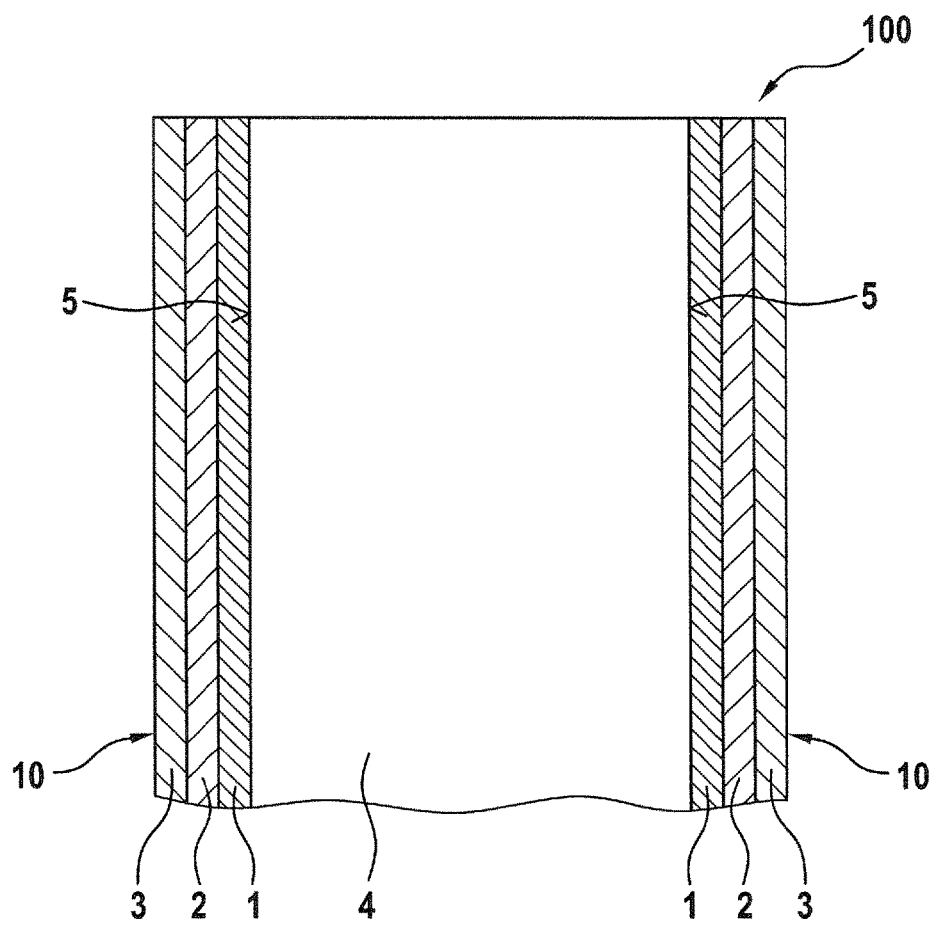

FIG. 5 shows a sectional view through a piston 100 according to an advantageous embodiment of the invention. The piston 100 is a metal component pursuant to the invention and can have a cylindrical geometry. The piston 100 comprises a piston volume 4. The side surfaces 5 bounding the piston volume 4 are the surfaces which are in frictional contact with a piston slideway during operation of the piston 100, for example in an internal combustion engine, and are also referred to as sliding surfaces or as the piston skirt. The side surfaces 5 have a coating 10 which is here formed by way of example of three individual layers and can thus be considered to be the coating 10 of FIG. 1.

However, it is also possible for the purposes of the invention for the inner layer 1 to comprise a plurality of individual layers, for example like the inner layer 1 in FIGS. 2 to 4 or for the intermediate layer 2 and/or the covering layer 3 to be made up of a plurality of layers.

In the section of the piston 100 shown in FIG. 5, an inner layer 1 serves to establish the bond between the side surface 5 of the piston 100 and the coating 10. An intermediate layer 2 and a covering layer 3 are arranged on the inner layer 1. The covering layer 3 is located on the surface of the piston 100 and allows friction-minimized sliding of the piston 100 in its piston slideway during the intended use of the piston 100. The individual layers can be applied to the side surfaces 5 of the piston 100, preferably by use of physical or chemical vapor deposition, in particular by PVD or PECVD. The piston 100 is highly wear resistant, abrasion resistant and has very good tribological properties which allow a long operational range with reduced fuel consumption and thus low $CO_2$ emission and hydrocarbon emission.

The above description of the present invention is merely for illustrative purposes and not for the purpose of restricting the invention. In the context of the invention, various changes and modifications are possible without going outside the scope of the invention and its equivalents.

LIST OF REFERENCE NUMERALS 1 inner layer
1a Cr layer
1b Cr/WC layer
1c W—C:H layer
1d CrN layer
1e WC/WC:H layer
2 intermediate layer
2a a-C:H layer
2b a-C:H* layer
3 covering layer
4 piston volume
5 side surface of the piston
10 coating
20 coating
30 coating
40 coating
100 piston The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A motor vehicle, comprising at least one piston of an internal combustion engine, the piston having a coating comprising:
    an inner layer which is applied to the piston;
    an intermediate layer; and
    a covering layer, wherein
    the inner layer comprises at least one layer selected from among: a metal layer, a metal carbide layer, a metal nitride layer, a metal carbonitride layer and a metal-containing hydrocarbon layer,
    the intermediate layer comprises an a-C:H layer and an a-C:H* layer, wherein the a-C:H* layer has a higher proportion of graphite-like parts than in the a-C:H layer,
    the covering layer comprises a W C:H layer or an a-C:H* layer,
    a maximum layer thickness of the coating is not more than 5 μm.

2. The motor vehicle according to claim 1, wherein in the coating, one of:
    the inner layer has a Cr layer, a Cr/WC layer and a W—C:H layer and the Cr layer is provided for application to the piston, or
    the inner layer has a CrN layer, a Cr/WC layer and a W—C:H layer and the CrN layer is provided for application to the piston, or
    the inner layer has a Cr layer, a CrN layer and a Cr/WC layer and the Cr layer is provided for application to the piston.

3. The motor vehicle according to claim 2, wherein the intermediate layer comprises an a-C:H layer.

4. The motor vehicle according to claim 1, wherein in the intermediate layer, the a-C:H layer faces the inner layer and the a-C:H* layer faces the covering layer.

5. The motor vehicle according to claim 1, wherein
    the inner layer is formed by a Cr layer or CrN layer, a Cr/WC layer and a W—C:H layer in this order, where the Cr layer or the CrN layer is provided for application to the piston,
    the intermediate layer is an a-C:H layer, and
    the covering layer is a W—C:H layer or an a-C:H* layer.

6. The motor vehicle according to claim 1, wherein
    the inner layer is formed by a Cr layer, a Cr/WC layer and a WC/W—C:H layer in this order, where the Cr layer is provided for application to the piston,
    the intermediate layer comprises an a C:H layer facing the inner layer and an a-C:H* layer facing the covering layer, and
    the covering layer is a W—C:H layer.

* * * * *